(12) United States Patent
Sugiyama

(10) Patent No.: US 10,109,543 B2
(45) Date of Patent: Oct. 23, 2018

(54) SEMICONDUCTOR MODULE AND RESIN CASE

(71) Applicant: FUJI ELECTRIC CO., LTD., Kawasaki (JP)

(72) Inventor: Takanori Sugiyama, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 0 days.

(21) Appl. No.: 15/018,230

(22) Filed: Feb. 8, 2016

(65) Prior Publication Data

US 2016/0276234 A1    Sep. 22, 2016

(30) Foreign Application Priority Data

Mar. 20, 2015    (JP) .................................. 2015-057925

(51) Int. Cl.
*H01L 23/053*    (2006.01)
*H01L 23/04*    (2006.01)

(52) U.S. Cl.
CPC ............ *H01L 23/053* (2013.01); *H01L 23/04* (2013.01); *H01L 2224/48091* (2013.01); *H01L 2224/48227* (2013.01); *H01L 2924/13055* (2013.01)

(58) Field of Classification Search
CPC ........ H01L 23/02–23/10; H01L 23/053; H01L 23/04–23/057
See application file for complete search history.

(56) References Cited

U.S. PATENT DOCUMENTS

| | | | |
|---|---|---|---|
| 5,625,536 A | 4/1997 | Soyano et al. | |
| 6,282,781 B1* | 9/2001 | Gotoh | H01L 21/4803 174/535 |
| 6,521,983 B1* | 2/2003 | Yoshimatsu | H01L 25/072 257/678 |
| 2002/0190374 A1 | 12/2002 | Nakajima et al. | |
| 2015/0061105 A1* | 3/2015 | Oose | H01L 23/049 257/704 |

FOREIGN PATENT DOCUMENTS

| | | |
|---|---|---|
| JP | 8-162571 | 6/1996 |
| JP | 2003-7966 | 1/2003 |
| JP | 2006-210500 | 8/2006 |
| JP | 2008-294362 | 12/2008 |

* cited by examiner

*Primary Examiner* — Stephen Bradley

(57) ABSTRACT

A semiconductor module includes a base substrate, a semiconductor element provided on the front surface side of the base substrate, and a resin case bonded to the front surface of the base substrate and enclosing a region in which the semiconductor element is provided, wherein the resin case has a depressed portion formed in a height direction away from the base substrate in a bottom surface bonded to the base substrate, and a connection hole that connects the depressed portion and the exterior of the resin case.

12 Claims, 14 Drawing Sheets

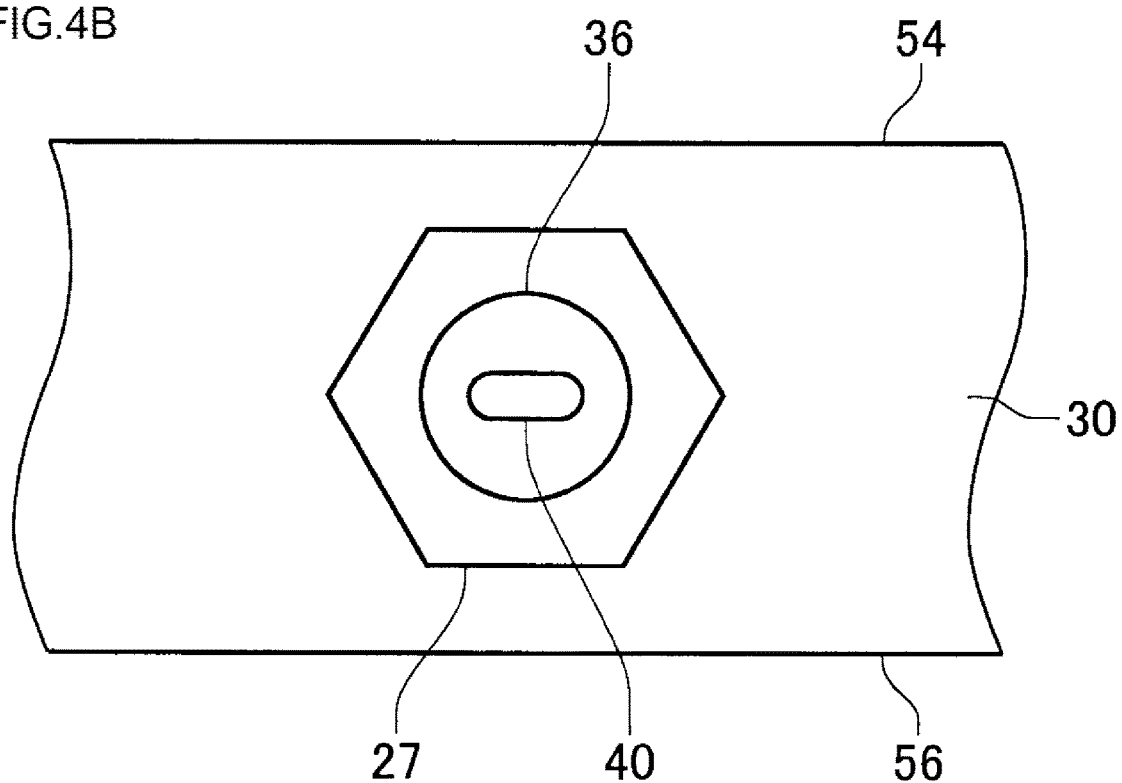

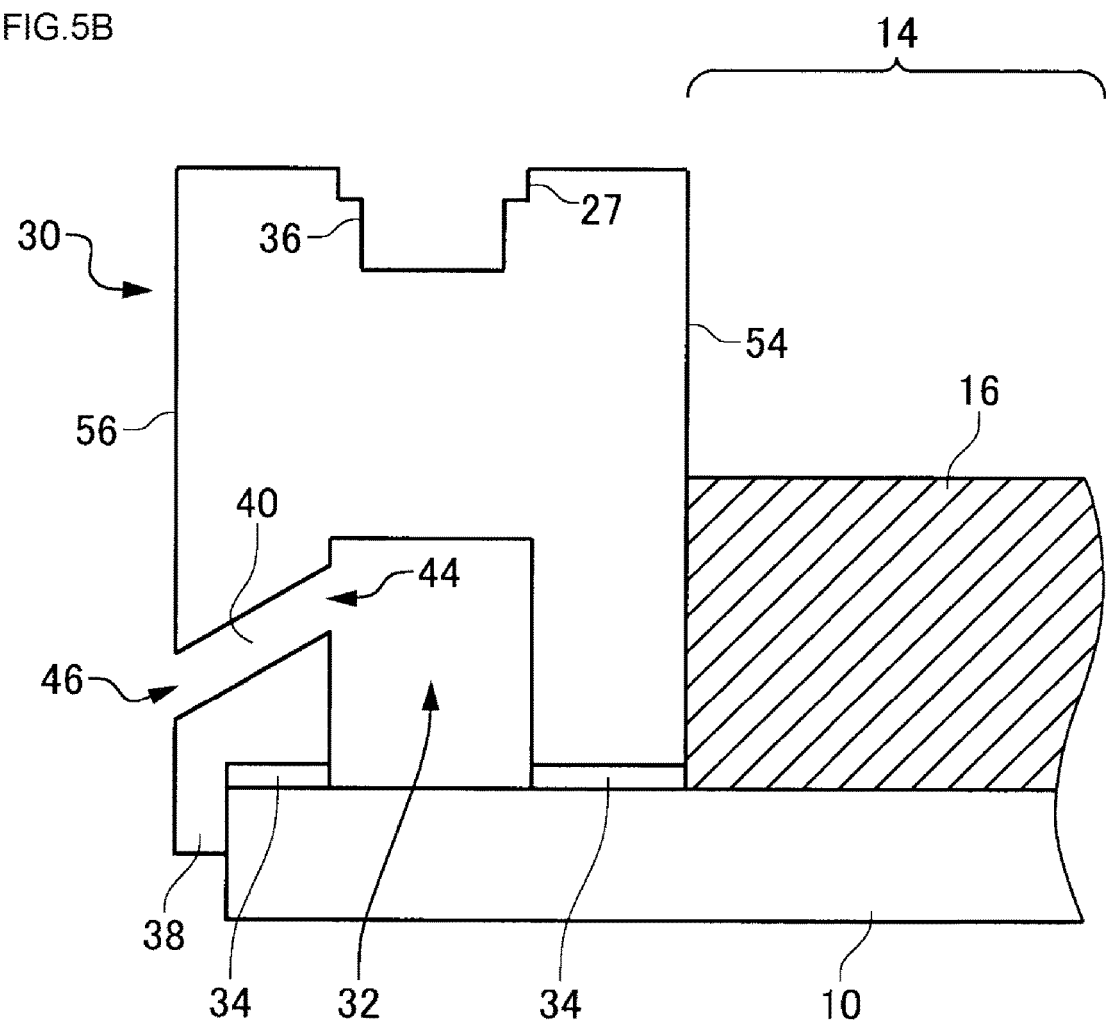

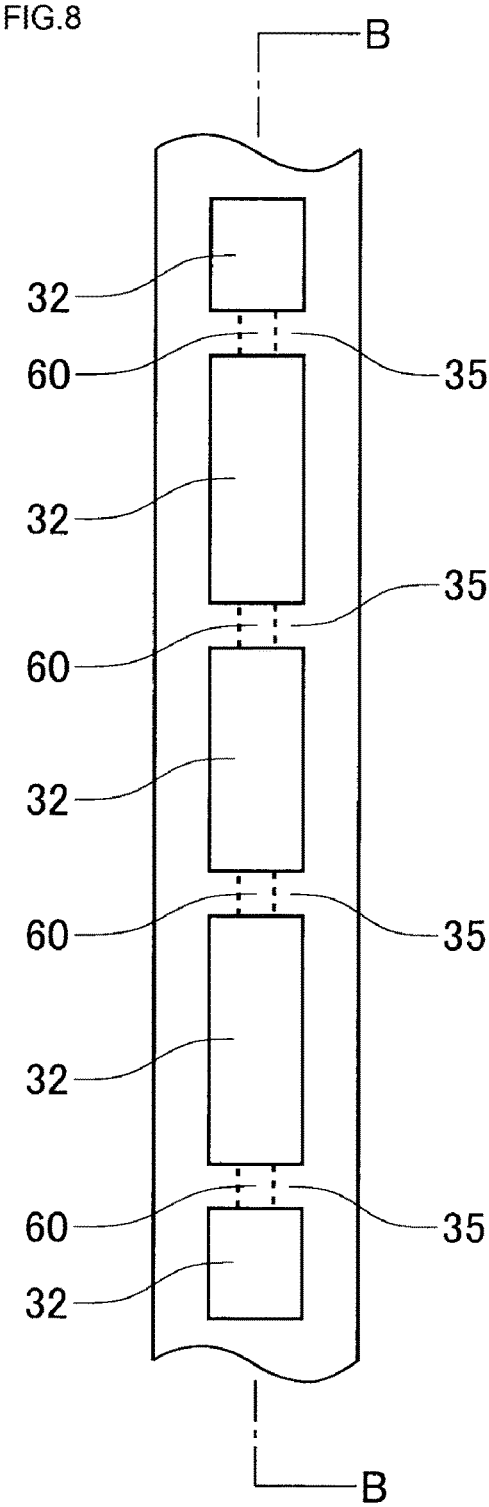

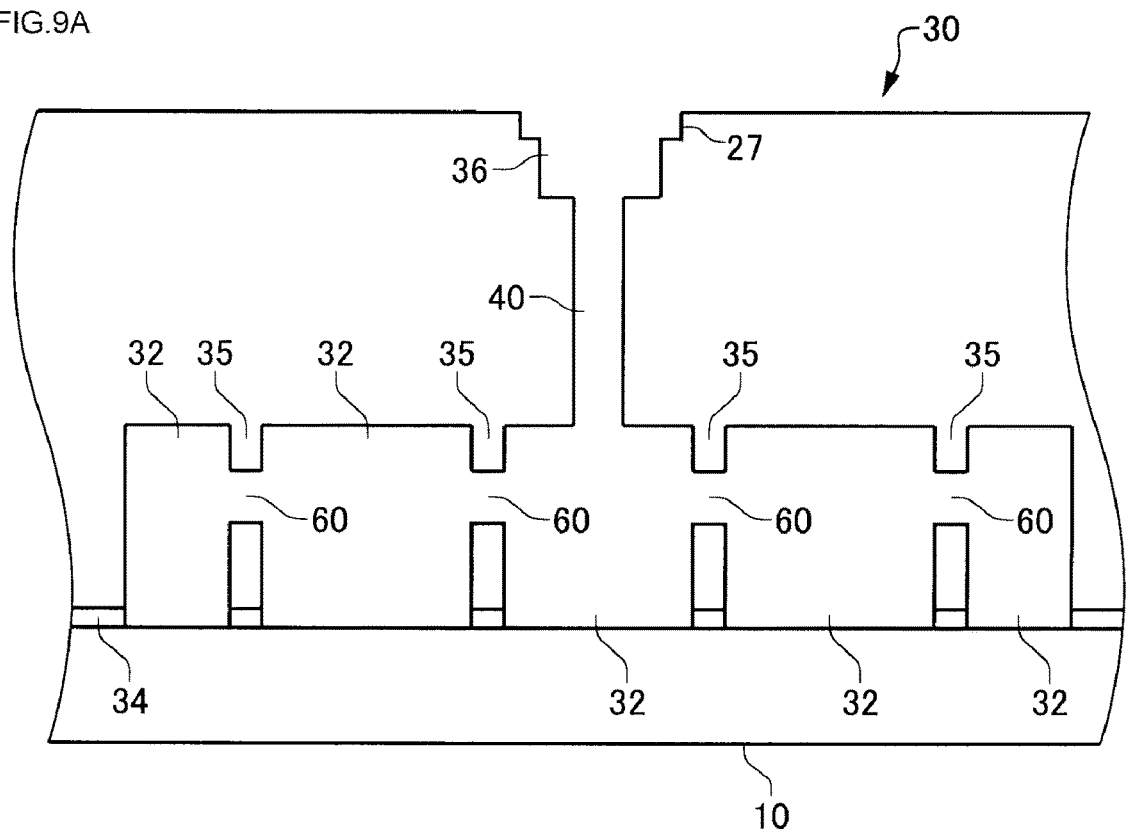

SEMICONDUCTOR MODULE AND RESIN CASE

CROSS-REFERENCE TO RELATED APPLICATIONS

This application claims benefit of foreign priority to Japanese Application 2015-057925 filed on Mar. 20, 2015, in the Japanese Patent Office, the disclosure of which is incorporated herein by reference.

BACKGROUND

1. Field

The present disclosure relates to a semiconductor module and a resin case.

2. Related Art

A semiconductor module that houses a semiconductor element such as an IGBT is already known. The semiconductor module is such that a semiconductor element provided on a base substrate is enclosed by a resin case, and the semiconductor element and an external electronic part are connected by a connection terminal provided on the resin case (for example, refer to JP-A-2008-294362).

SUMMARY

A void may occur in a thick part of a resin case because the amount of resin contraction accompanying cooling when molding the resin case is large. In order to reduce the occurrence of voids, providing in advance a thinned (also called a lightened) portion not filled with resin material in the thick portion of the resin case is conceivable.

The thinned portion is sealed by the resin case being bonded to a base substrate. However, a gaseous body inside the thinned portion of the resin case expands due to a process such as the semiconductor module being heated or exposed to a vacuum atmosphere. Further, the expanded gaseous body may exert stress on the bonding portion bonding the resin case and the base substrate, whereby the bonding portion becomes detached.

A first aspect of the disclosure provides a semiconductor module including a base substrate, a semiconductor element provided on the front surface side of the base substrate, and a resin case bonded to the front surface of the base substrate and enclosing a region in which the semiconductor element is provided, wherein the resin case has a depressed portion formed in a height direction away from the base substrate in a bottom surface bonded to the base substrate, and a connection hole that connects the depressed portion and the exterior of the resin case.

A second aspect of the disclosure provides a resin case bonded to the front surface of a base substrate on the front surface side of which a semiconductor element is provided and enclosing a region in which the semiconductor element is provided, the resin case including a depressed portion formed in a height direction away from the base substrate in a bottom surface bonded to the base substrate, and a connection hole that connects the depressed portion and the exterior of the resin case.

The heretofore described outline of the disclosure does not detail all the characteristics of the invention. Also, sub-combinations of these characteristic groups may be included in the invention.

BRIEF DESCRIPTION OF THE DRAWINGS

These and/or others aspects and advantages will become apparent and more readily appreciated from the following description of the embodiments, taken in conjunction with eh accompanying drawings of which:

FIG. 4B shows a surface of the wall portion according to the first example;

FIG. 5B shows a sectional view of the wall portion according to a modification example of the second example;

FIG. 8 is a diagram showing a modification example of the wall portion applied to each example;

FIG. 9A is a diagram showing an example of a linking portion;

DESCRIPTION OF EMBODIMENTS

Hereafter, the invention will be described via an embodiment of the disclosure, but the embodiment does not limit the invention according to the scope of the claims. Also, not all combinations of characteristics described in the embodiment are necessarily essential to the solution proposed by the disclosure.

Figure 1:
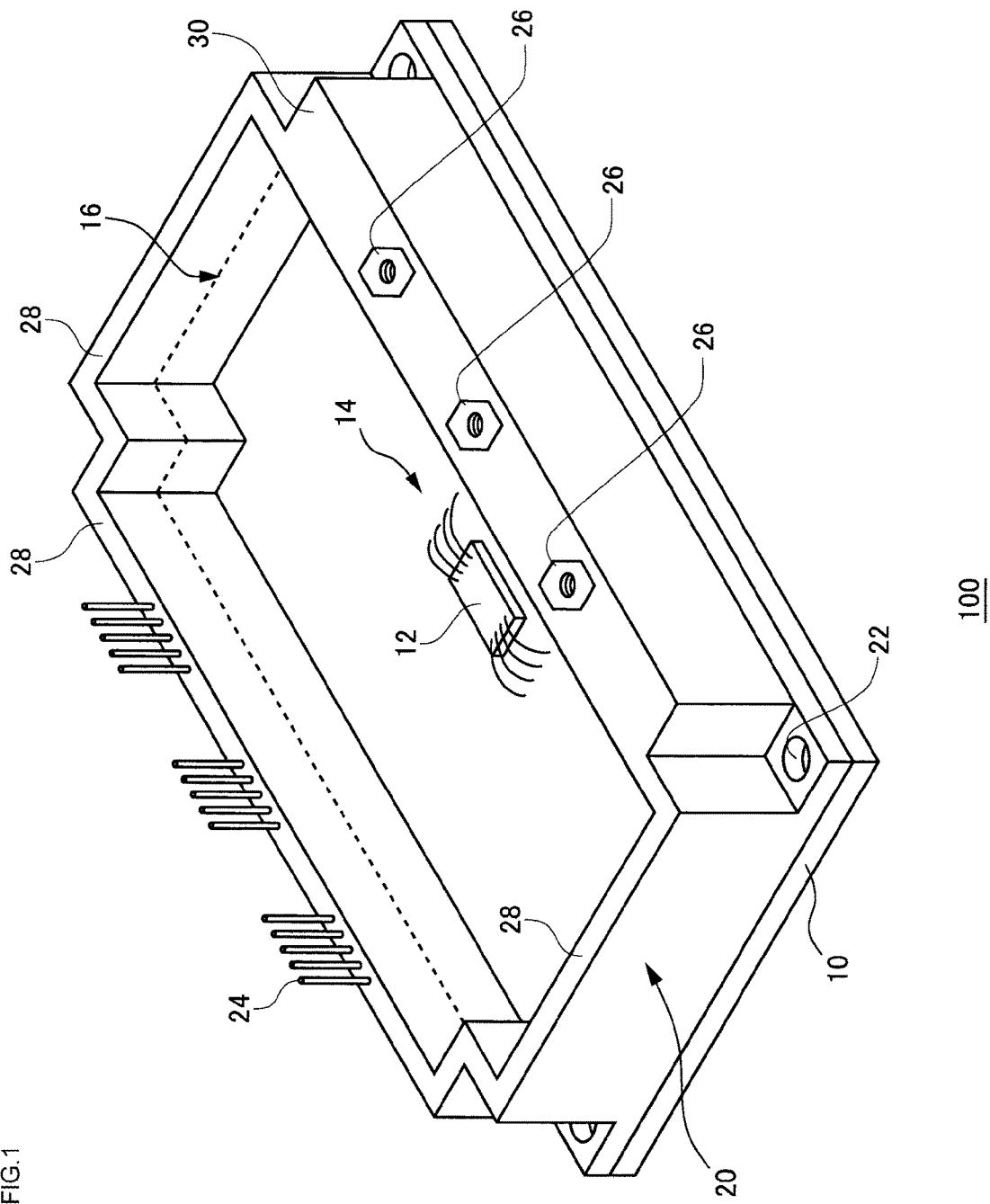
FIG. 1 is a diagram showing a semiconductor module according to an embodiment of the disclosure.

FIG. 1 is a diagram showing a semiconductor module 100 according to an embodiment of the disclosure. FIG. 1 shows a perspective view of the semiconductor module 100. The semiconductor module 100 has a base substrate 10, a resin case 20, and an internal circuit of a semiconductor element 12 and the like.

The internal circuit of the semiconductor element 12 and the like is disposed on the front surface side of the base substrate 10. The semiconductor element 12 is a power semiconductor element such as an IGBT. An insulating layer, or an insulating layer on both surfaces of which a metal layer is formed, may be provided between the internal circuit and the base substrate 10. The base substrate 10 is formed of a material such as copper, which has higher thermal conductivity than resin.

The resin case 20 is bonded to the front surface of the base substrate 10. Also, the resin case 20 is such that a joining member such as a screw is inserted into a hole portion 22. The resin case 20 is provided so as to enclose a region 14 in which the internal circuit is provided. The resin case 20 of this example has a wall portion 28 and wall portion 30 enclosing the region 14.

The wall portion 30 is a wall that is thicker than the wall portion 28. That is, the wall portion 30 is the thickest of the wall portions in the resin case 20. The resin case 20 may have four wall portions enclosing the four sides of the region 14. Also, a continuous region of practically equal thickness in the resin case 20 may be taken to be one wall portion. That is, the wall portion 30 may refer to the continuous region having the greatest thickness in the resin case 20. The thickness of a wall portion refers to the thickness between the internal wall on the region 14 side and the external wall opposing the internal wall. The bottom surfaces of the wall portion 28 and wall portion 30 are bonded to the front surface of the base substrate 10. Also, the wall portion 28 and wall portion 30 are provided extending in a direction perpendicular to the front surface of the base substrate 10. The wall portion 28 and wall portion 30 may be formed integrally.

In this example, a sealing portion 16 that seals at least one portion of the internal circuit of the semiconductor element 12 and the like is provided in the region 14 enclosed by the resin case 20. The sealing portion 16 is provided to a predetermined height from the front surface of the base substrate 10. In FIG. 1, the position of the height direction in which the sealing portion 16 is formed is indicated by a broken line. The sealing portion 16 may have a height such that all the semiconductor element 12 can be sealed, and may have a height such that wiring in the internal circuit can be sealed.

One or more connection terminals 24 are provided in at least one portion of the wall portion 28 and wall portion 30. Each connection terminal 24 in this example is inserted in the surfaces of the wall portion 28 and wall portion 30 on the side opposite to that of the base substrate 10. In FIG. 1, the connection terminal 24 is provided in only the surface of one wall portion 28, but the connection terminal 24 may also be provided in the other wall portions 28 and the wall portion 30. An end portion of the connection terminal 24 on the side inserted into the resin case 20 is electrically connected to the internal circuit of the semiconductor element 12 and the like. Also, an end portion of the connection terminal 24 on the side not inserted into the resin case 20 is inserted into an insertion hole of an electrical part, such as a printed circuit board, provided opposing the semiconductor module 100.

Also, the semiconductor module 100 may further include a cover portion covering the region 14. The cover portion may be fixed to the front surface of at least one portion of the wall portion 28 and the wall portion 30. The wall portion 30 of this example has one or more nuts 26 that fix the cover portion or a conductive member to the front surface of the wall portion 30. The nut 26 may be inserted into or housed in a depressed portion formed in the front surface of the wall portion 30. The cover portion may be an electrical part, such as a printed circuit board, connected to the semiconductor module 100. The conductive member may be a metal part, such as a copper wire or copper plate, that electrically connects the semiconductor module 100 and a power source or load.

Figure 2:
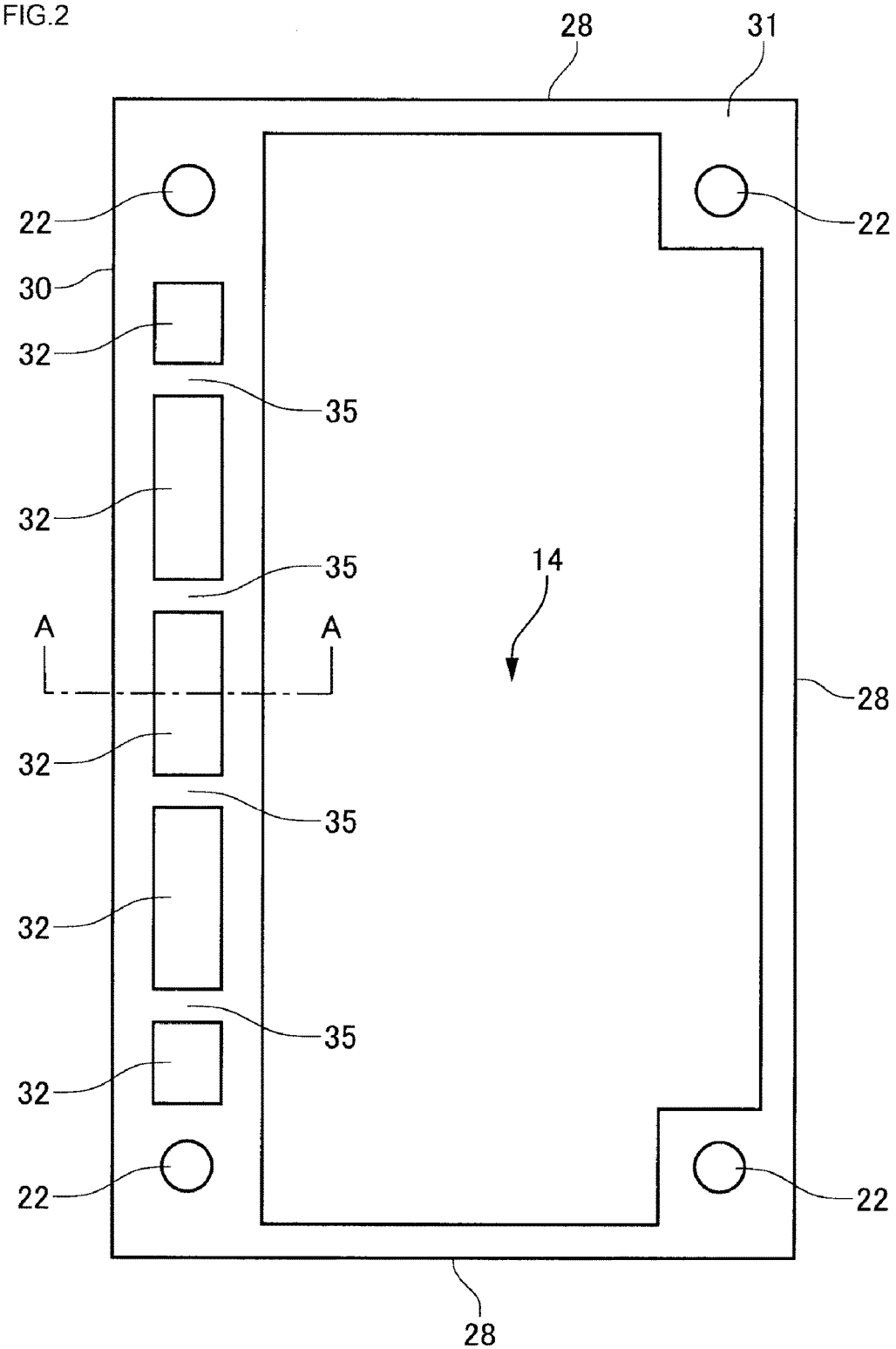
FIG. 2 is a diagram showing an example of a bottom surface of a resin case.

FIG. 2 is a diagram showing an example of a bottom surface 31 of the resin case 20. As heretofore described, an adhesive that bonds the base substrate 10 and the resin case 20 is applied to the bottom surface 31. The adhesive is applied so as to pass unbroken at least once around the multiple of wall portions 28 and the wall portion 30. That is, the adhesive is applied to the bottom surface 31 so as to enclose unbroken the region 14.

A multiple of depressed portions 32 are provided in the resin case 20. The depressed portion 32 is formed in a height direction from the bottom surface of the resin case 20, away from the base substrate 10. Of the wall portions, the depressed portion 32 of this example is provided in at least the wall portion 30, which has the greatest thickness. The depressed portion 32 has an aperture in the bottom surface of the wall portion 30, and extends in a height direction perpendicular to the front surface of the base substrate 10. The depressed portion 32 may be formed in a multiple of wall portions that have a thickness of a pre-specified value or greater.

The sizes of the apertures of the multiple of depressed portions 32 may be the same, or may differ. In this example, the multiple of depressed portions 32 are arrayed linearly, and the aperture areas of the depressed portions 32 at either end are smaller than the aperture areas of the other depressed portions 32. The depressed portions 32 are separated by separating walls 35. The separating wall 35 is one portion of the wall portion 30. The thickness of the separating wall 35 may be the same as that of the wall portion 28, which has the smallest thickness, or may be smaller.

Figure 3:
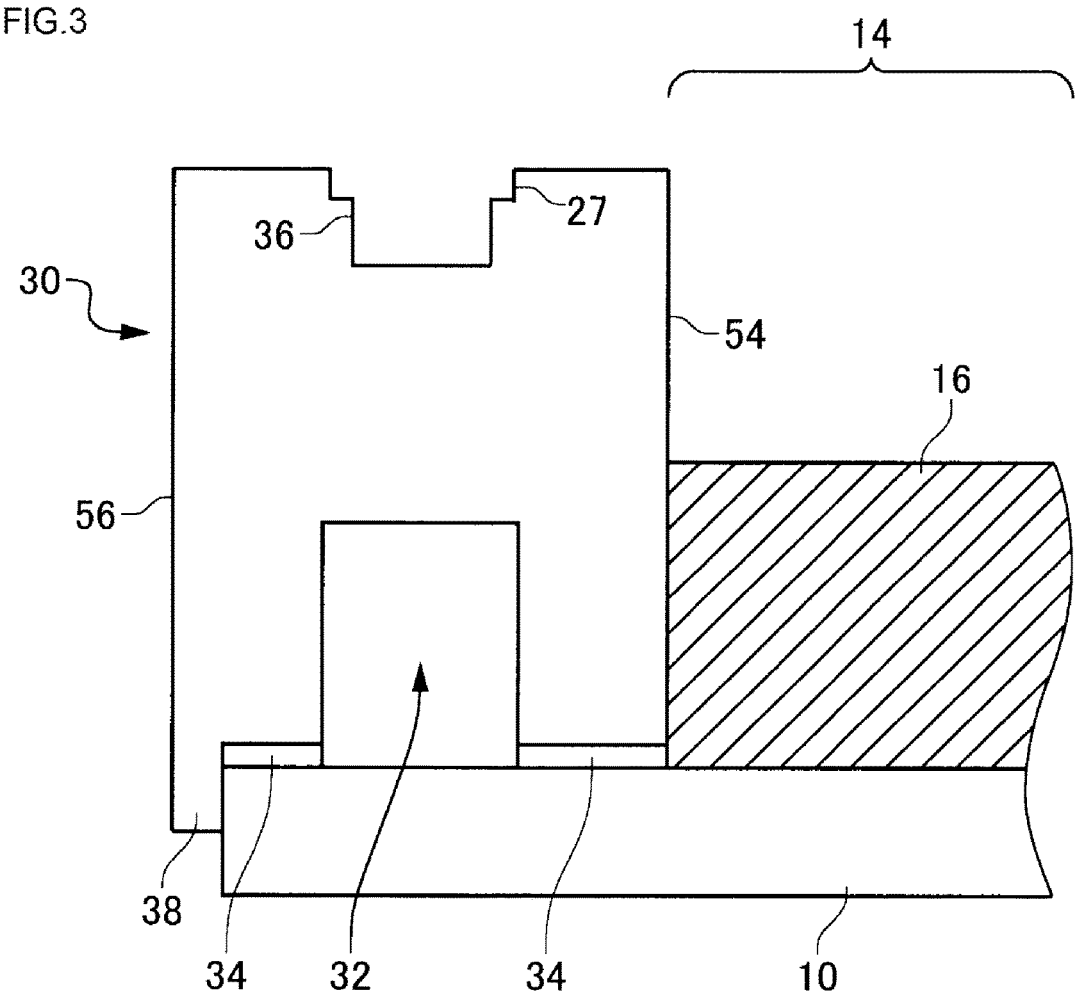
FIG. 3 shows a sectional view of a wall portion according to a comparison example.

FIG. 3 shows a sectional view of the wall portion 30 according to a comparison example. FIG. 3 shows an A-A section of FIG. 2. A projection 38 that comes into contact with the outer periphery of the base substrate 10, thereby positioning the base substrate 10, may be provided in the wall portion 30. The projection 38 may be provided along the outer periphery of the resin case 20. Also, a screw fixing hole 36 is formed in the front surface of the wall portion 30. Also, a depressed portion 27 into which the nut 26 shown in FIG. 1 is inserted is formed on the upper side of the screw fixing hole 36. By the nut 26 being provided in the depressed portion 27, the nut 26 is provided neighboring the screw fixing hole 36. By a screw or the like being inserted into the screw fixing hole 36 and the nut 26, the cover portion, the conductive member, or the like, is fixed to the front surface of the wall portion 30. At least one screw fixing hole 36 may be provided in a position opposing one of the depressed portions 32.

The wall portion 30 has an internal wall 54 on the region 14 side, and an external wall 56 opposing the internal wall 54. The depressed portion 32 is provided between the internal wall 54 and the external wall 56. The depressed portion 32 is formed so that the width remaining between the external wall 56 or the internal wall 54 and the depressed portion 32 is equal to or greater than the width of the wall portion 28, which has the smallest thickness. The depressed portion 32 may be formed in the center between the internal wall 54 and the external wall 56.

A bonding portion 34 is formed on the bottom surface of the wall portion 30. The bonding portion 34 is formed so as to enclose the depressed portion 32. Therefore, the depressed portion 32 is sealed by the base substrate 10 and the resin case 20. After bonding the resin case 20 to the base substrate 10, the sealing portion 16 is formed in the region 14.

The sealing portion 16 is formed of a material that has fluidity before a predetermined process such as heating and is hardened by the predetermined process, as is the case with silicone gel. Also, the material of the sealing portion 16 has insulating properties.

When injecting a material such as silicone gel, it is preferable that the material is injected in a vacuum atmosphere in order to prevent moisture and air bubbles from being mixed with the material. However, when the semiconductor module 100 is exposed to a vacuum atmosphere after the resin case 20 is bonded to the base substrate 10, a gaseous body inside the depressed portion 32 expands.

Also, the gaseous body inside the depressed portion 32 also expands when heating the semiconductor module 100 in order to harden the material such as silicone gel. When the gaseous body inside the depressed portion 32 expands due to these kinds of process, stress is exerted on the bonding portion 34, and the bonding portion 34 may become detached. In this case, a failure occurs in that silicone gel or the like leaks out from the detached portion of the bonding portion 34.

Releasing the gaseous body inside the depressed portion 32 between bonding portions 34 by applying the bonding portion 34 discretely is conceivable. However, the bonding strength decreases. Also, it is difficult to accurately control the interval between bonding portions 34.

Figure 4A:
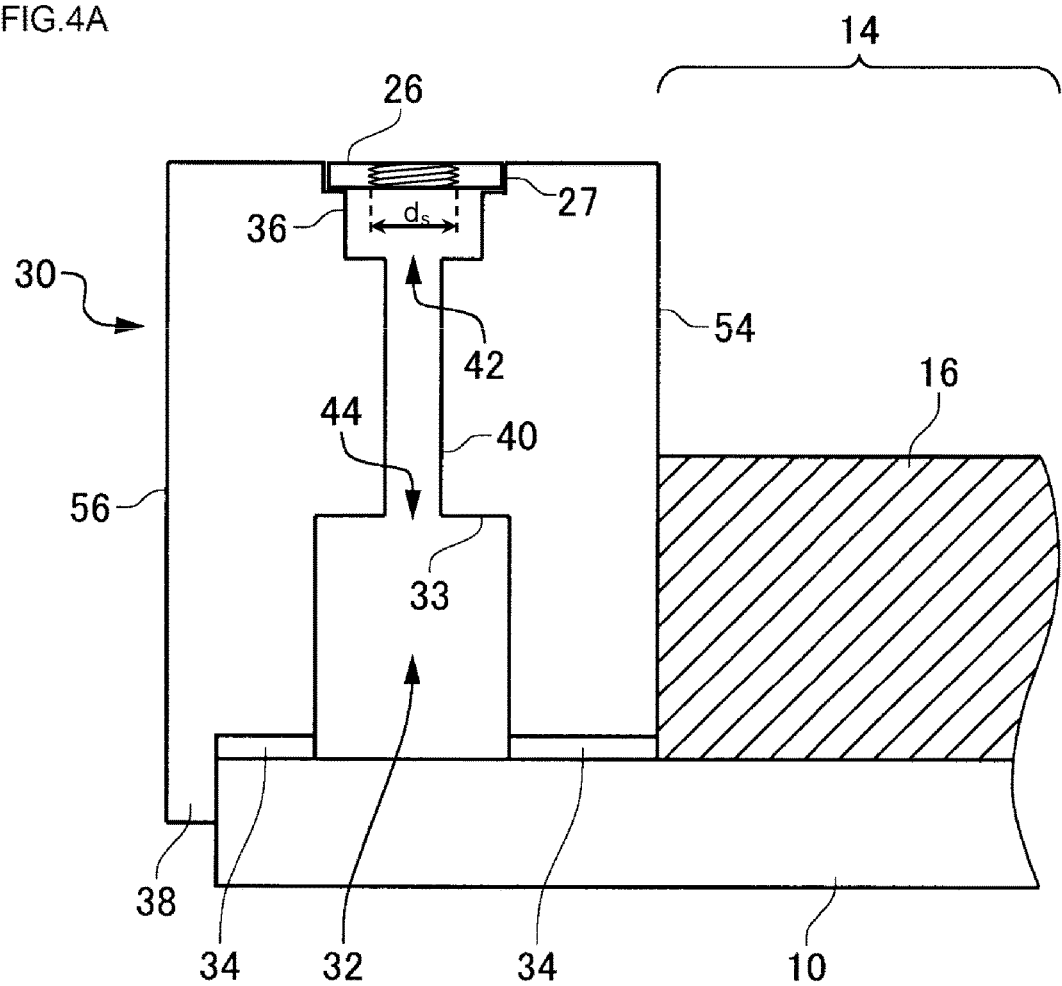
FIG. 4A shows a sectional view of the wall portion according to a first example.

FIG. 4A shows a sectional view of the wall portion 30 according to a first example. The wall portion 30 of this example differs from the configuration of the wall portion 30 shown in FIG. 3 in further including a connection hole 40. The configuration other than the connection hole 40 is the same as that of the wall portion 30 shown in FIG. 3.

The connection hole 40 connects the depressed portion 32 and the exterior of the resin case 20. Therefore, even when the gaseous body inside the depressed portion 32 expands, the gaseous body can be released to outside the resin case 20. Therefore, detachment of the bonding portion 34 can be prevented.

The depressed portion 32 has an apex portion 33 on the side opposite to that of the base substrate 10. The apex portion 33 refers to a place in the depressed portion 32 in which the distance from the front surface of the base substrate 10 is the greatest. The depressed portion 32 of this example has a cuboid form. The surface of the cuboid on the side opposite to that of the base substrate 10 corresponds to the apex portion 33. The connection hole 40 connects the apex portion 33 of the depressed portion 32 and the exterior of the resin case 20. The connection hole 40 has an aperture 42 on the exterior side of the resin case 20, and an aperture 44 on the depressed portion 32 side.

The exterior side aperture 42 in this example is formed in the bottom surface of the screw fixing hole 36. Also, the depressed portion 32 side aperture 44 is formed in the apex portion 33 of the depressed portion 32. It is preferable that the diameter of the exterior side aperture 42 is smaller than the inner diameter of the screw fixing hole 36. By narrowing the connection hole 40, thereby restricting a reduction in thickness, the gaseous body can be released to outside the resin case 20 without the strength of the resin case 20 being lost. Also, by narrowing the connection hole 40, the possibility of a foreign object contaminating the inside of the depressed portion 32 can be reduced. Also, the screw fixing hole 36 is blocked with a screw or the like after the sealing portion 16 is formed. Therefore, when forming the sealing portion 16, contamination of the depressed portion 32 by a foreign object can be prevented after fixing the screw, while connecting the interior of the depressed portion 32 to the exterior of the resin case 20. The screw or the like inserted into the screw fixing hole 36 may be provided so as not to reach the connection hole 40. The diameter of the connection hole 40 may be smaller than the diameter of the screw or the like. In FIG. 4A, $d_s$ represents the diameter of the screw or the like when received in the nut 26 and accommodated in the screw fixing hole 26.

The connection hole 40 may be formed to extend perpendicular to the base substrate 10 in the height direction from the apex portion 33 of the depressed portion 32. Also, the connection hole 40 may have a bent portion that bends in a place between the depressed portion 32 side aperture 44 and the aperture 42 on the exterior side of the resin case 20. In this case, the possibility of a foreign object falling into the depressed portion 32 can be reduced.

The diameter of the aperture 42 of the connection hole 40 may be one-half or less the inner diameter of the screw fixing hole 36. The area of the aperture 44 of the connection hole 40 may be one-half or less the area of the apex portion 33 of the depressed portion 32. Also, the diameter of the aperture 44 of the connection hole 40 may be one-half or less the width of the depressed portion 32. The width of the depressed portion 32 refers to the width in a direction from the internal wall 54 toward the external wall 56. The area of the apex portion 33 of the depressed portion 32 may be greater than the area of the bottom surface of the screw fixing hole 36. The connection hole 40 may have a uniform thickness from the aperture 42 to the aperture 44.

The aperture 42 of the connection hole 40 may be provided in the center of the bottom surface of the screw fixing hole 36. Also, the aperture 44 of the connection hole 40 may be provided in the center of the apex portion 33 of the depressed portion 32. The diameter of the aperture 42 may be the same as the diameter of the aperture 44, or may be smaller.

FIG. 4B is a diagram showing the front surface of the wall portion 30 according to the first example. As heretofore described, the connection hole 40 is provided in the bottom surface of the screw fixing hole 36. The sectional form of the connection hole 40 may be a circular form, or may be an elliptical or oval form. In FIG. 4B, the connection hole 40 is shown with an oval sectional form. It is preferable that the ellipsoid or oval has the long axis thereof in a direction parallel to the wall portion 30 (or to the external wall 56 and internal wall 54). In this case, the decrease in thickness between the external wall 56 and the internal wall 54 can be reduced, and the gaseous body can be released to outside the resin case 20 without the strength of the resin case 20 being lost.

The nut 26, not shown in the drawing, is disposed in the depressed portion 27. In this example, the screw fixing hole 36 is formed in the vicinity of the center of the depressed portion 27. The nut 26 is of an approximate regular hexagonal prism form, and the depressed portion 27 too may be of a hexagonal prism form that can house the nut 26. The screw fixing hole 36 disposed on the bottom surface side of the depressed portion 27 is of a cylindrical form. In this example, the axis of the depressed portion 27 and the axis of the screw fixing hole 36 may coincide. The connection hole 40 may be provided in the vicinity of these axes, that is, in the vicinity of the center of the screw fixing hole 36. It is further preferable that the depressed portion 27 is disposed so that two opposing faces of the depressed portion 27 are parallel to the external wall 56 and the internal wall 54. As the long axis of the connection hole 40 is positioned in the vicinity of a plane including the two opposing faces of the depressed portion 27 in this case, cracking of the resin case 20 that may occur when inserting a screw in the nut 26 and applying torque can be prevented.

Figure 4C:
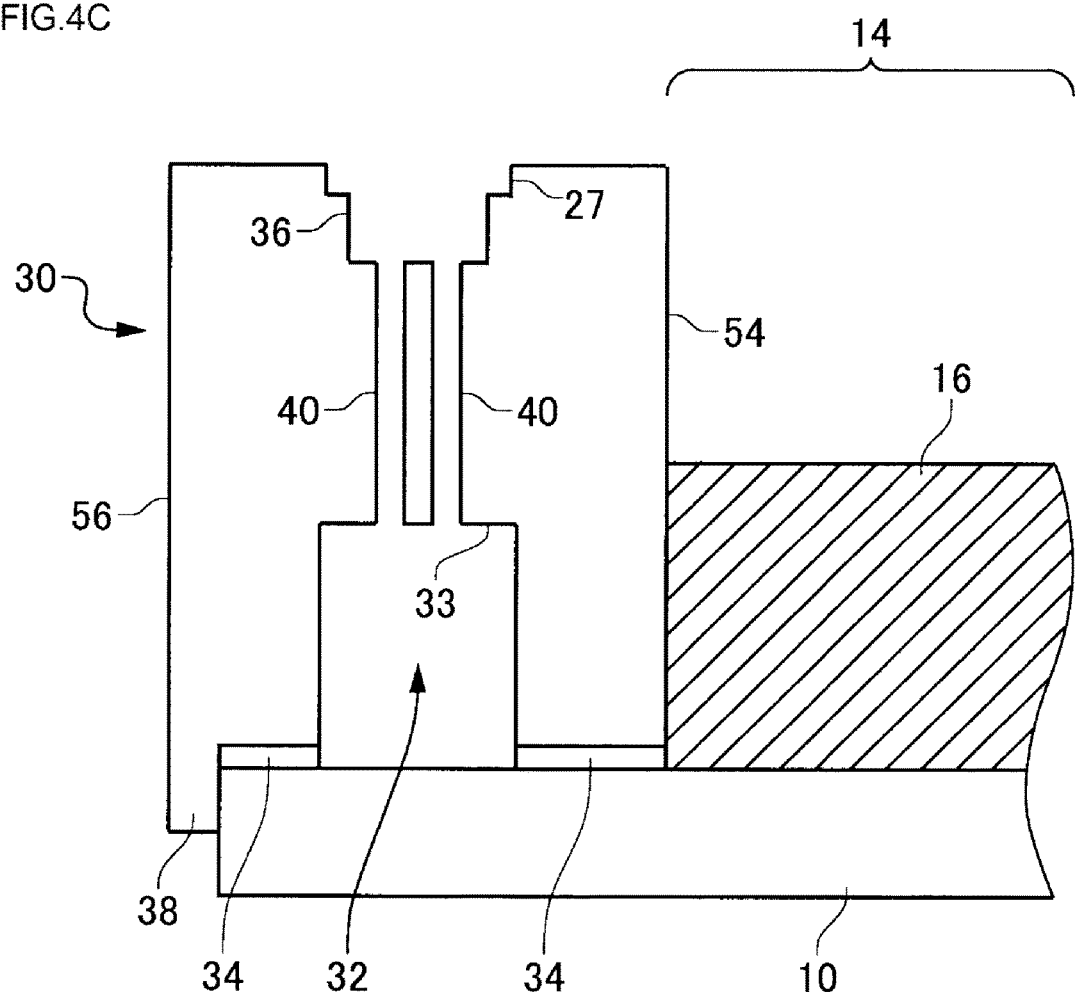
FIG. 4C shows a sectional view of the wall portion according to a modification example of the first example.

FIG. 4C shows a sectional view of the wall portion 30 according to a modification example of the first example. The wall portion 30 of this example differs from the configuration of the wall portion 30 shown in FIG. 4A in that one depressed portion 32 includes a multiple of connection holes 40. Other than including the multiple of connection holes 40, the configuration may be the same as that of the wall portion 30 shown in FIG. 4A.

Each connection hole 40 connects the apex portion 33 of the depressed portion 32 and the bottom surface of the screw fixing hole 36. The form of each connection hole 40 may be the same as that of the connection hole 40 described in FIG. 4A. However, the sum of the diameters of the apertures of the connection holes 40 on the exterior side of the resin case 20 may be one-half or less of the inner diameter of the screw fixing hole 36. In this example, the diameter of each of the connection holes 40 can be reduced, because of which a large foreign body can be prevented from contaminating the inside of the depressed portion 32. The diameter of each of the connection holes 40 may be the same. Also, the diameter of each of the connection holes 40 may differ.

Figure 4D:
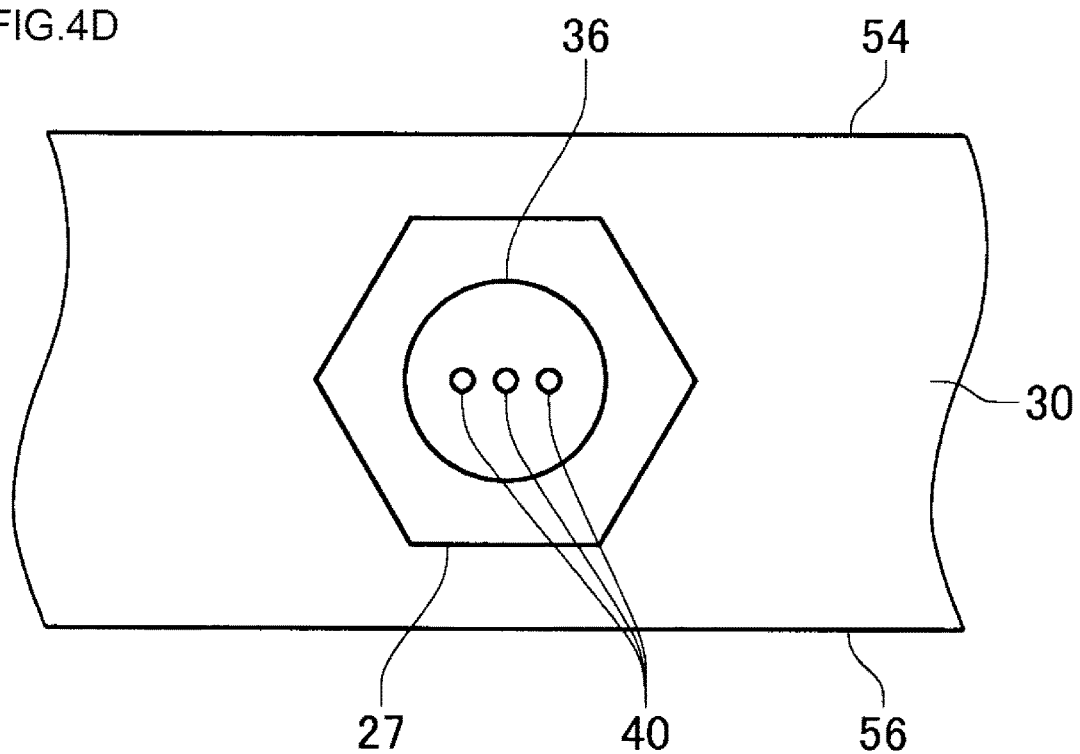
FIG. 4D shows a surface of the wall portion according to a modification example of the first example.

FIG. 4D shows the front surface of the wall portion 30 according to a modification example of the first example. In the example of FIG. 4C, the multiple of connection holes 40 are arrayed in a direction perpendicular to the external wall 56 and internal wall 54, but the multiple of connection holes 40 of this example are arrayed in parallel to the wall portion 30 (or to the external wall 56 and the internal wall 54) in the center of the screw fixing hole 36. In this case, the decrease in thickness between the external wall 56 and the internal wall 54 can be reduced, and the gaseous body can be released to outside the resin case 20 without the strength of the resin case 20 being lost. The nut 26, not shown in the drawing, is disposed in the depressed portion 27. The forms and dispositions of the depressed portion 27 and the screw fixing hole 36 are the same as in the example shown in FIG. 4B. The multiple of connection holes 40 may be provided in the vicinity of the axes of the depressed portion 27 and the screw fixing hole 36, that is, in the vicinity of the center of the screw fixing hole 36. By the multiple of connection holes 40 being disposed in the vicinity of a plane including the two opposing faces of the depressed portion 27, cracking of the resin case 20 that may occur when inserting a screw in the nut 26 and applying torque can be prevented.

Figure 5A:
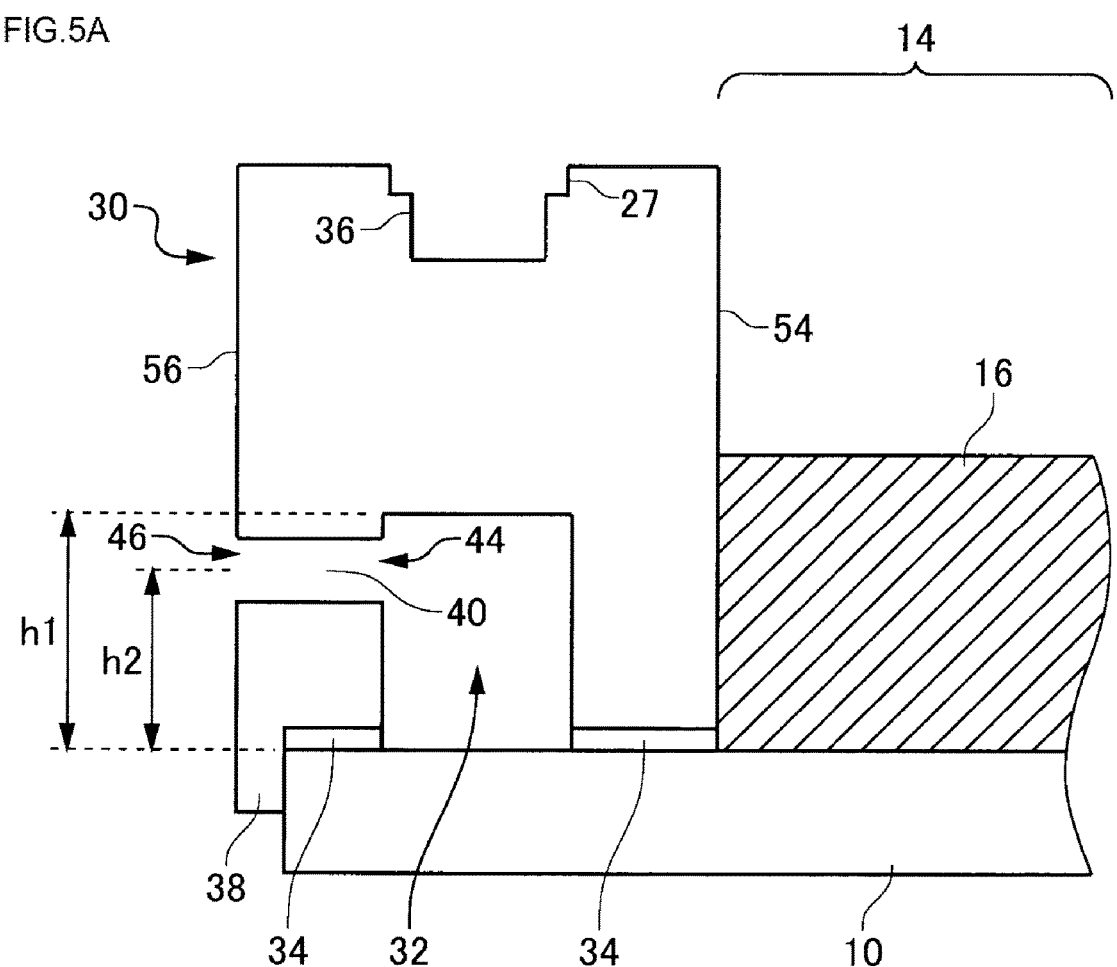
FIG. 5A shows a sectional view of the wall portion according to a second example.

FIG. 5A shows a sectional view of the wall portion 30 according to a second example. The wall portion 30 of this example is such that the position in which the connection hole 40 is provided differs from that in the configuration of the wall portion 30 shown in FIGS. 4A to 4D. Other than the position of the connection hole 40, the configuration is the same as that shown in FIGS. 4A through 4D.

The connection hole 40 of this example connects the depressed portion 32 and the external wall 56 of the wall portion 30. That is, the connection hole 40 has the aperture 44 provided in the depressed portion 32 and an aperture 46 provided in the external wall 56. The depressed portion 32 side aperture 44 of the connection hole 40 is provided in a side face of the depressed portion 32. The side face of the depressed portion 32 is a face extending in the height direction from, for example, the front surface side of the base substrate 10.

The connection hole 40 of this example extends in a horizontal direction approximately parallel to the front surface of the base substrate 10. The external wall 56 side aperture 46 and the depressed portion 32 side aperture 44 are provided toward the apex portion 33 between the front surface of the base substrate 10 and the apex portion 33 of the depressed portion 32. The positions of the aperture 44 and the aperture 46 are regulated by the center or center of gravity position of each aperture. That is, a height h2 of the center position of the aperture 44 and the aperture 46, with the front surface of the base substrate 10 as a reference, is greater than one-half of a height h1 of the apex portion 33.

An outer peripheral portion of the base substrate 10 and the resin case 20 warps in accordance with the difference between the thermal expansion coefficients of the base substrate 10 and the resin case 20. By the connection hole 40 being provided toward the apex portion 33, the amount of resin to the base substrate 10 side of the connection hole 40 can be increased, because of which the strength of the resin case 20 can be maintained. It is preferable that the diameters of the aperture 44 and the aperture 46 of the connection hole 40 are one-half or less of the height h1 of the apex portion 33. Therefore, the strength of the resin case 20 can be maintained. The diameters of the aperture 44 and the aperture 46 of the connection hole 40 may be one-quarter or more of the height h1.

Also, the depressed portion 32 may be provided toward the external wall 56 between the internal wall 54 and external wall 56 of the wall portion 30. In this case, the connection hole 40 can be shortened. Also, the depressed portion 32 may be provided toward the internal wall 54. In this case, the thickness on the side on which the connection hole 40 is provided can be increased.

FIG. 5B shows a sectional view of the wall portion 30 according to a modification example of the second example. The wall portion 30 of this example is such that the form of the connection hole 40 differs from that of the configuration of the wall portion 30 shown in FIG. 5A. Other than the form of the connection hole 40, the configuration may be the same as that of the wall portion 30 shown in FIG. 5A.

The connection hole 40 of this example extends in a direction nearing the base substrate 10 in at least one region from the depressed portion 32 side aperture 44 toward the external wall 56 side aperture 46. That is, the connection hole 40 of this example extends downward of the horizontal direction (toward the base substrate 10) in at least one region from the depressed portion 32 side aperture 44 toward the external wall 56 side aperture 46.

The connection hole 40 shown in FIG. 5B extends downward of the horizontal direction in all regions from the depressed portion 32 side aperture 44 toward the external wall 56 side aperture 46. The connection hole 40 may descend vertically toward the front surface of the base substrate 10 in one region from the depressed portion 32 side aperture 44 toward the external wall 56 side aperture 46. According to this kind of configuration, foreign objects can be prevented from infiltrating from the connection hole 40.

Figure 6:
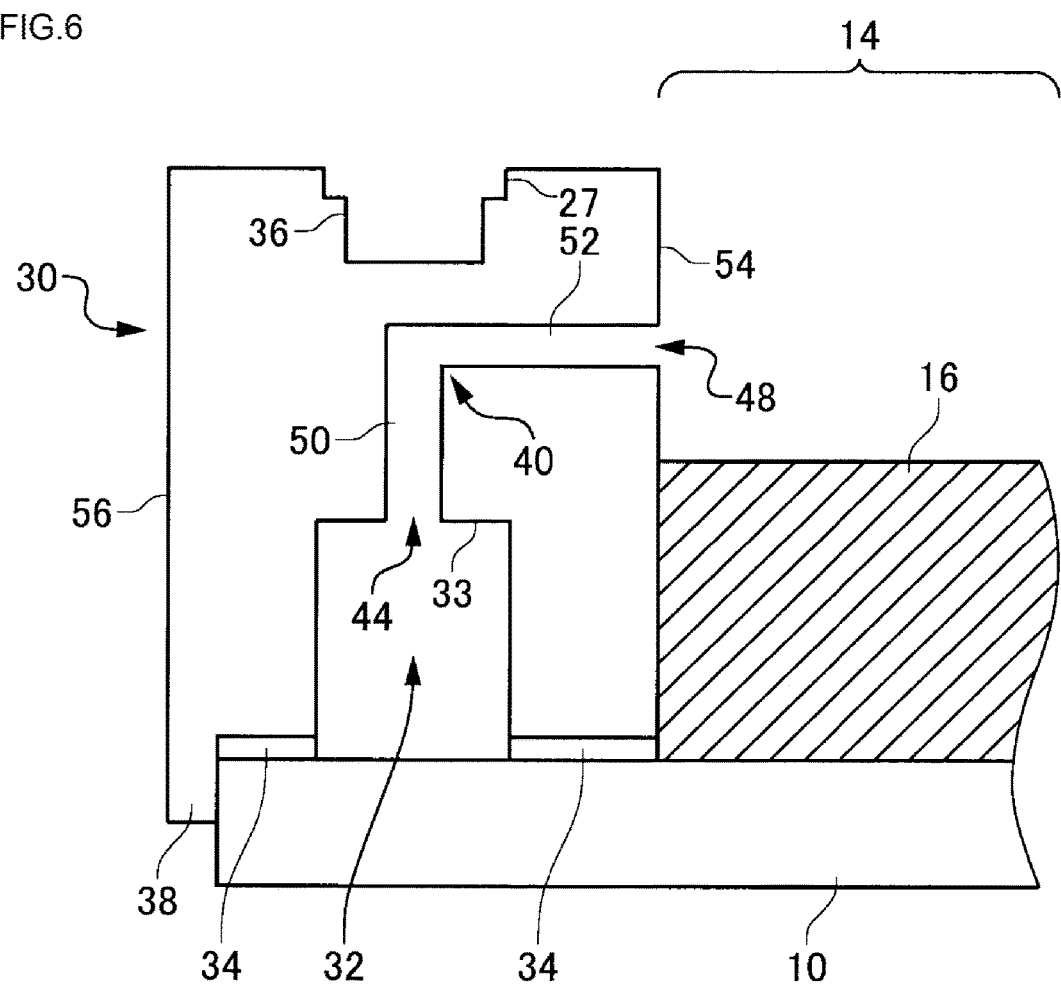
FIG. 6 shows a sectional view of the wall portion according to a third example.

FIG. 6 shows a sectional view of the wall portion 30 according to a third example. The wall portion 30 of this example is such that the form of the connection hole 40 differs from that of the wall portion 30 shown in FIGS. 4A through 4D. Other than the form of the connection hole 40, the configuration may be the same as that of the wall portion 30 shown in FIGS. 4A through 4D.

The connection hole 40 of this example connects the depressed portion 32 and the internal wall 54 of the wall portion 30. That is, the connection hole 40 has the depressed portion 32 side aperture 44 and an aperture 48 on the internal wall 54 side. The aperture 44 of this example is provided in the apex portion 33 of the depressed portion 32.

The internal wall 54 side aperture 48 of the connection hole 40 is formed in a position higher than the front surface of the sealing portion 16 in the height direction perpendicular to the front surface of the base substrate 10. The position of the aperture 48 in this example is regulated by the position of the lowermost end of the aperture 48. That is, the whole of the aperture 48 is exposed without being covered by the sealing portion 16.

The sealing portion 16 may be formed to a position higher than the apex portion 33 of the depressed portion 32. In this case, it is preferable that the depressed portion 32 side aperture 44 of the connection hole 40 is provided in the apex portion 33. The connection hole 40 of this example has a first region 50 extending in the height direction from the depressed portion 32 side aperture 44, and a second region 52 connecting an end portion of the first region 50 and the internal wall 54 side aperture 48. The first region 50 may extend in the height direction perpendicular to the front surface of the base substrate 10. The second region 52 may extend parallel to the front surface of the base substrate 10.

According to this kind of configuration too, detachment of the bonding portion 34 can be prevented. Also, as the internal wall 54 side of the wall portion 30 is reinforced by the sealing portion 16, the strength of the wall portion 30 can be maintained even when the connection hole 40 is provided on the internal wall 54 side. In the same way as the connection hole 40 shown in FIG. 5B, the second region 52 may extend in a direction toward the front surface side of the base substrate 10 in at least one region from the end portion of the first region 50 toward the internal wall 54 side aperture 48.

Also, the depressed portion 32 may be provided toward the external wall 56 between the internal wall 54 and the external wall 56 of the wall portion 30. In this case, the thickness of the wall on the side on which the connection hole 40 is provided can be increased. Also, the depressed portion 32 may be provided toward the internal wall 54. In this case, the connection hole 40 can be shortened.

Figure 7:
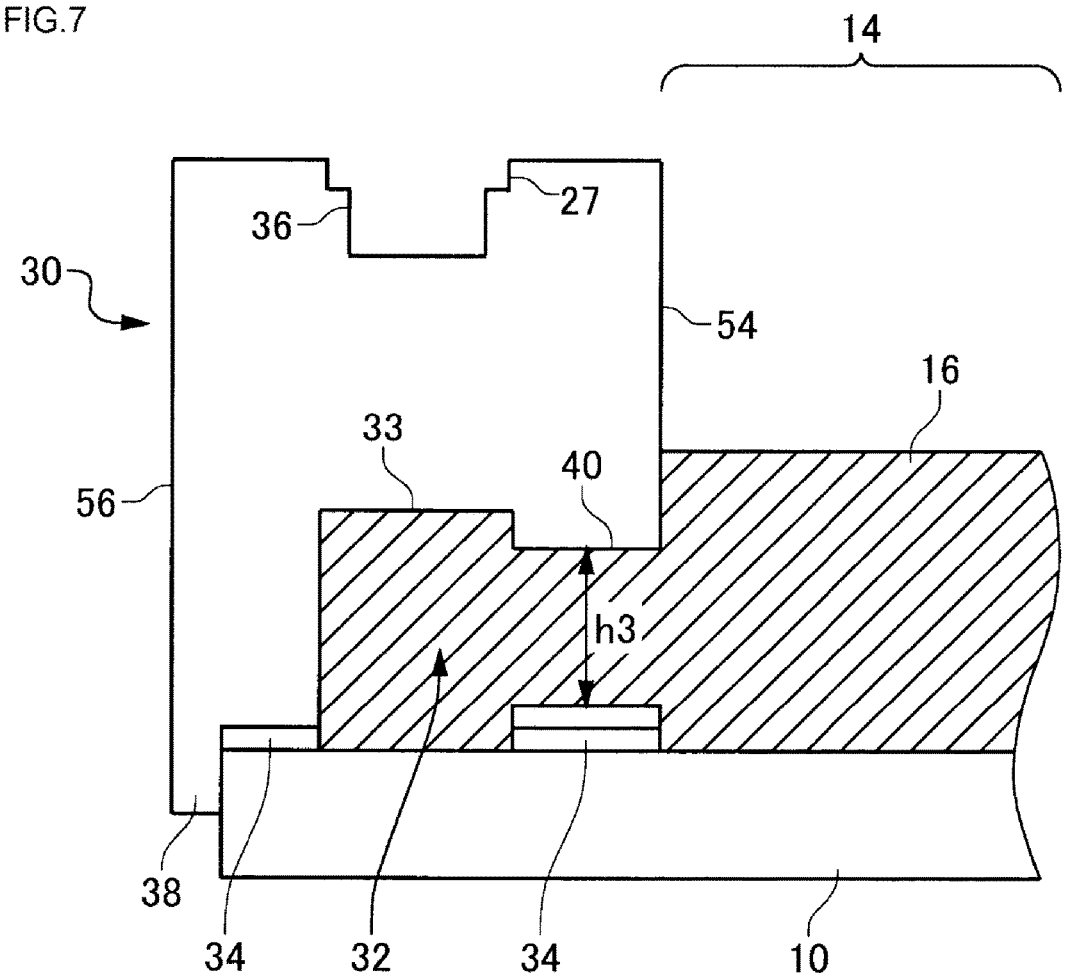
FIG. 7 shows a sectional view of the wall portion according to a fourth example.

FIG. 7 shows a sectional view of the wall portion 30 according to a fourth example. The wall portion 30 of this example is such that the form of the connection hole 40 differs from that of the wall portion 30 shown in FIGS. 4A through 4D. Other than the form of the connection hole 40, the configuration may be the same as that of the wall portion 30 shown in FIGS. 4A through 4D.

The connection hole 40 of this example connects the depressed portion 32 and the internal wall 54 of the wall portion 30. However, the position of the internal wall 54 side aperture of the connection hole 40 in this example is lower than the front surface of the sealing portion 16. The position of the uppermost end on the internal wall 54 side of the connection hole 40 may be lower than the front surface of the sealing portion 16. Also, the apex portion 33 of the depressed portion 32 is also provided in a position lower than the front surface of the sealing portion 16. Also, it is preferable that the bonding portion 34 and resin case 20 remain on the lower side of the connection hole 40. Therefore, a decrease in bonding strength can be prevented.

In this example, the sealing portion 16 is formed in the interiors of the depressed portion 32 and the connection hole 40 too. When the material of the sealing portion 16 is injected into the region 14, the material of the sealing portion 16 is simultaneously injected into the depressed portion 32 and the connection hole 40 too. According to this kind of configuration, the gaseous body can be removed from inside the depressed portion 32.

Also, when the material of the sealing portion 16 is heated after being injected into the interior of the depressed portion 32, the possibility of the material expanding and exerting stress on the bonding portion 34 is conceivable. However, by increasing the sectional area of the connection hole 40, a path along which the material of the sealing portion 16 expanded when heating returns to the region 14 can be secured. Therefore, detachment of the bonding portion 34 can be prevented.

The connection hole 40 may extend parallel to the front surface of the base substrate 10 between the depressed portion 32 side aperture and the internal wall 54 side aperture. In order that the material of the sealing portion 16 can be sufficiently injected into the depressed portion 32, it is preferable that a height h3 of the apertures in the connection hole 40 is greater than one-half of the height of the apex portion 33 of the depressed portion 32.

The height h3 of the connection hole 40 may be 90% or more of the height of the apex portion 33. Also, the height position of the upper end of the connection hole 40 may be the same as the height position of the apex portion 33 of the depressed portion 32. Therefore, the gaseous body remaining in the depressed portion 32 when the material of the sealing portion 16 is injected into the depressed portion 32 can be reduced. The height position of the upper end of the connection hole 40 may be higher than the apex portion 33 of the depressed portion 32 within a range lower than the front surface of the sealing portion 16.

The length in the depth direction of the connection hole 40 shown in FIG. 7 may be less than the length in the depth direction of the depressed portion 32. The depth direction refers to a direction perpendicular to the height direction in a plane parallel to the internal wall 54. The length in the depth direction of the connection hole 40 may be the same as the length in the depth direction of the depressed portion 32. In this example, the interior of the connection hole 40 is also sealed with the sealing portion 16, because of which the strength of the resin case 20 can be maintained even when the length in the depth direction of the connection hole 40 is increased.

FIG. 8 is a diagram showing a modification example of the wall portion 30 applied to each example. FIG. 8 shows one portion of the bottom surface of the wall portion 30. A multiple of depressed portions 32 are arrayed linearly in the bottom surface of the wall portion 30. The wall portion 30 of this example is such that a linking portion 60 linking neighboring depressed portions 32 is formed. The linking portion 60 is provided in the separating wall 35 that separates neighboring depressed portions 32. Also, any connection hole 40 according to the first to fourth examples is formed in any one depressed portion 32 of a group of depressed portions 32 linked by the linking portion 60.

FIG. 9A is a diagram showing an example of the linking portion 60. FIG. 9A shows a B-B section of FIG. 8. The linking portion 60 of this example is formed penetrating the separating wall 35. The linking portion 60 may be provided toward the apex portion of the depressed portion 32, in the same way as the connection hole 40 shown in FIG. 5A. Also, the diameter in the height direction of the linking portion 60 is one-half or less of the height of the depressed portion 32. The diameter of the linking portion 60 may be one-quarter or more of the height of the depressed portion 32.

In this example, the connection hole 40 is provided in the central depressed portion 32 of the multiple of depressed portions 32 disposed linearly and linked by the linking portion 60. As heretofore described, the connection hole 40 may be any connection hole 40 of the first to fourth examples. According to this kind of configuration, the number of connection holes 40 can be reduced, whereby the strength of the resin case 20 can be secured.

Also, in another example, the connection hole 40 may be provided in the largest depressed portion 32 of a multiple of depressed portions 32 of differing sizes. Also, the connection hole 40 may be provided in every second one of linearly disposed depressed portions 32. In this case, the size of the depressed portion 32 in which the connection hole 40 is provided may be greater than that of the depressed portion 32 in which the connection hole 40 is not provided. Herein, the size of the depressed portion 32 refers to the volume of the internal space of the depressed portion 32. Also, the linking portion 60 may be provided toward the internal wall 54 from the center of a side surface of the depressed portion 32. Therefore, the strength of an outer edge portion of the resin case 20 can be maintained.

Figure 9B:
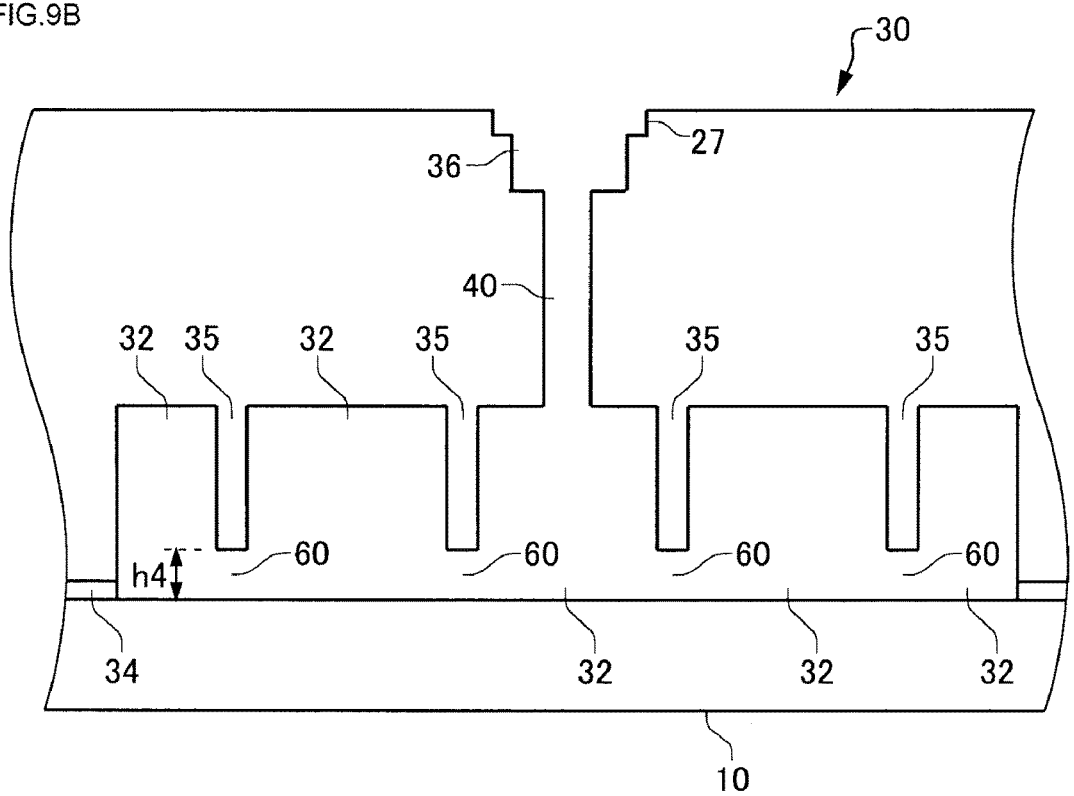
FIG. 9B is a diagram showing a modification example of the wall portion applied to each example.

FIG. 9B is a diagram showing a modification example of the wall portion 30 applied to each example. The wall portion 30 of this example is such that the form of the linking portion 60 differs from that of the wall portion 30 shown in FIG. 9A. Other than the form of the linking portion 60, the structure may be the same as that of the wall portion 30 shown in FIG. 9A.

The linking portion 60 of this example is formed by cutting away a bottom portion of the wall portion 30. The size of the cutaway is the same as that of the linking portion 60 of through hole form shown in FIG. 9A. For example, a height h4 of the cutaway is one-half or less of the height of the depressed portion 32. Also, the height h4 of the cutaway may be one-quarter or more of the height of the depressed portion 32. According to this kind of structure too, a multiple of depressed portions 32 are linked, whereby the number of connection holes 40 can be reduced.

According to each example, detachment of the bonding portion 34 due to expansion of the gaseous body in the depressed portion 32 can be prevented. Also, as the possibility of bonding portion 34 detachment is low even when the depressed portion 32 is provided, the range over which the depressed portion 32 is applicable increases. Therefore, the depressed portion 32 is applicable to resin cases of various aspects, and the occurrence of voids in the resin case can be reduced. Consequently, a resin case and a semiconductor module of high quality can be provided.

The sectional form of the connection hole 40 may be circular, may be rectangular, or may be of another form. Also, the sectional form of the linking portion 60 may be circular, may be rectangular, or may be of another form. When the sections of the connection hole 40 and the linking portion 60 are not circular, the diameters thereof may refer to the greatest width of the sectional form.

Heretofore, the disclosure has been described using an embodiment, but the technical scope of the disclosure is not limited to the scope described in the embodiment. It will be clear to those skilled in the art that a large variety of changes or improvements can be added to the embodiment without departing from the principles and spirit of the disclosure. It will be clear from the description in the claims that an aspect to which this kind of change or improvement has been added may also be included in the technical scope of the disclosure.

It should be noted that unless particularly stated as being "before", "preceding", or the like, or unless the output of a previous process is used in a subsequent process, the execution of each process such as an operation, a procedure, a step, or a stage in a device, a system, a program, or a method shown in the claims, a specification, or drawings may be realized in an arbitrary order. With regard to an operation flow in the claims, a specification, or drawings, "firstly,", "next", or the like being used in a description for the sake of convenience does not mean that it is essential that the operation flow is implemented in this order.

What is claimed is:

1. A semiconductor module, comprising:
    a base substrate;
    a semiconductor element provided on a front surface of the base substrate; and
    a resin case bonded by a bonding portion to the front surface of the base substrate and having
        wall portions enclosing a region in which the semiconductor element is provided,
        a depressed portion formed in at least a thickest wall portion of the wall portions and depressed, from a bottom surface of the thickest wall portion bonded to the base substrate, in a height direction away from the base substrate, the depressed portion being enclosed by the bonding portion,
        a nut to receive a screw,
        a screw hole located below the nut and formed in a front surface of the thickest wall portion, the screw hole having an inner surface that defines an inner diameter of the screw hole and defines a space to accommodate the screw when the screw is inserted through the nut and into the screw hole, and
        a connection hole having an aperture on a bottom of the screw hole, the aperture having a diameter smaller than the inner diameter of the screw hole, the connection hole connecting between the depressed portion and the screw hole,
        wherein a diameter of the connection hole is smaller than a diameter of the screw.

2. The semiconductor module according to claim 1, wherein
    the depressed portion has an apex portion on an inner side of the depressed portion opposite to the base substrate, and
    the connection hole connects the apex portion of the depressed portion and an exterior of the resin case.

3. The semiconductor module according to claim 2, wherein
    the connection hole is extending, in the height direction, from the apex portion of the depressed portion.

4. The semiconductor module according to claim 1, wherein
    the resin case has an internal wall and an external wall, the internal wall opposing the external wall and being nearer than the external wall to the region in which the semiconductor element is provided, and
    the diameter of the aperture of the connection hole is one-half or less of the width of the depressed portion in a direction from the internal wall toward the external wall.

5. The semiconductor module according to claim 4, wherein the connection hole is one among a plurality of connection holes connecting the apex portion of the depressed portion to an exterior of the resin case.

6. The semiconductor module according to claim 1, wherein
    the depressed portion is one among a plurality of the depressed portion formed in the resin case, the plurality of depressed portions being separated from each other by separating walls disposed between neighboring depressed portions of the plurality of depressed portions,
    each of the separating walls has a linking portion through which interiors of neighboring depressed portions separated by the separating wall are in communication with each other, and
    the connection hole is formed in any one of the plurality of depressed portions linked by the linking portions.

7. The semiconductor module according to claim 6, wherein
    the plurality of depressed portions are arrayed linearly, and the connection hole is formed in a central depressed portion of the plurality of linearly arrayed depressed portions.

8. The semiconductor module according to claim 5, wherein
    the depressed portion is one among a plurality of the depressed portion formed in the resin case, the plurality of depressed portions being separated from each other by separating walls disposed between neighboring depressed portions of the plurality of depressed portions, each of the separating walls has a linking portion through which interiors of neighboring depressed portions separated by the separating wall are in communication with each other, and the connection hole is formed in any one of the plurality of depressed portions linked by the linking portions.

9. The semiconductor module according to claim 1, wherein the diameter of the aperture of the connection hole is one-half or less of the inner diameter of the screw hole.

10. A resin case for a semiconductor module having a base substrate and a semiconductor element on a front surface of the base substrate, the resin case comprising:

an enclosure portion having a bottom surface and configured to enclose a region of the front surface of the base substrate when the bottom surface is bonded to the front surface of the substrate;

a depressed portion formed in at least a section of the enclosure portion and depressed, from the bottom surface, in a height direction toward a surface of the resin case opposite to the bottom surface;

a nut to receive a screw;

a screw hole located below the nut and formed in a front surface of the enclosure portion, the screw hole having an inner surface that defines an inner diameter of the screw hole and defines a space to accommodate the screw when the screw is inserted through the nut and into the screw hole; and a connection hole having an aperture on a bottom of the screw hole, the aperture having a diameter smaller than the inner diameter of the screw hole, the connection hole connecting between the depressed portion and the screw hole.

11. The resin case according to claim 10, wherein a diameter of the connection hole is smaller than a diameter of the screw.

12. The resin case according to claim 10, wherein the diameter of the aperture of the connection hole is one-half or less of the inner diameter of the screw hole.

\* \* \* \* \*